(12) United States Patent
Chawla et al.

(10) Patent No.: US 6,587,019 B2
(45) Date of Patent: Jul. 1, 2003

(54) DUAL DIRECTIONAL HARMONICS DISSIPATION SYSTEM

(75) Inventors: Yogendra K. Chawla, Pittsford, NY (US); David Freese, Rochester, NY (US)

(73) Assignee: ENI Technology, Inc., Rochester, NY (US)

( * ) Notice: Subject to any disclaimer, the term of this patent is extended or adjusted under 35 U.S.C. 154(b) by 0 days.

(21) Appl. No.: 09/832,476

(22) Filed: Apr. 11, 2001

(65) Prior Publication Data
US 2002/0149445 A1 Oct. 17, 2002

(51) Int. Cl.[7] .............................................. H03H 7/01
(52) U.S. Cl. ...................................... 333/176; 333/167
(58) Field of Search ................................ 333/112, 124, 333/129, 132, 167, 174–176

(56) References Cited

U.S. PATENT DOCUMENTS

| | | | | |
|---|---|---|---|---|
| 3,271,705 A | * | 9/1966 | Karkar ........................ | 333/176 |
| 4,003,005 A | * | 1/1977 | Mukherjee et al. ......... | 333/124 |
| 4,846,920 A | * | 7/1989 | Keller et al. ................ | 118/620 |
| 4,849,721 A | * | 7/1989 | Matsuura .................... | 333/174 |
| 5,072,200 A | * | 12/1991 | Ranky ........................ | 333/172 |
| 5,187,457 A | | 2/1993 | Chawla et al. .............. | 333/170 |
| 5,969,582 A | * | 10/1999 | Boesch et al. .............. | 333/129 |
| 6,046,641 A | | 4/2000 | Chawla et al. .............. | 330/277 |

FOREIGN PATENT DOCUMENTS

| | | | |
|---|---|---|---|
| JP | 0213009 A | * | 9/1991 |
| JP | 2000261270 A | * | 9/2000 |

* cited by examiner

Primary Examiner—Seungsook Ham
(74) Attorney, Agent, or Firm—Harness, Dickey & Pierce, P.L.C.

(57) ABSTRACT

An apparatus is disclosed wherein a dual directional harmonics dissipation filter includes an input terminal coupled to a RF power amplifier providing a radio frequency signal in a predetermined frequency range, an output terminal for providing the radio frequency signal to a load at the predetermined frequency range, a low pass filter connected between the input terminal and the output terminal, and a plurality of high pass filters coupled to the low pass filter wherein the plurality of high pass filters receive and dissipate signals in excess of the predetermined frequency range and wherein the plurality of high pass filter's effect on the impedance is offset at the input and output of the low pass filter. Energy dissipation in an RF generator system is accomplished by supplying an RF signal from a RF power amplifier, diverting signals from the RF power amplifier having frequencies in excess of a predetermined frequency range to a first high pass filter, dissipating the signal in excess of the predetermined frequency range, and receiving harmonic energy from a plasma chamber to a second high pass filter, and dissipating the harmonic energy.

38 Claims, 2 Drawing Sheets

DUAL DIRECTIONAL HARMONICS DISSIPATION SYSTEM

FIELD OF THE INVENTION

This invention relates to high power RF amplifier systems, such as those employed in semiconductor plasma processing applications.

BACKGROUND OF THE INVENTION

Plasma processing installations, which includes plasma reactors, are in widespread use in semiconductor fabrication. Plasma reactors are used to change the electrical characteristics of raw materials (e.g. silicon) during the manufacture of semiconductor-based electrical components like discrete transistors, medium and large scale integrated circuits, microprocessors and random-access memories. Typical operations performed using plasma reactors include sputtering, plasma etching, plasma deposition, and reactive ion etching.

In operation, a semiconductor work-piece is placed in the reactor. Next, gas is introduced into the plasma reactor at low pressure. Then, radio frequency (RF) power is applied to the gas to convert the gas into a plasma. The plasma is comprised of electrically-charged ions that react with exposed regions of the semiconductor work-piece. As a result of many such operations, electrical circuits are created in the semiconductor work-piece.

Plasma processing installations used in semiconductor fabrication generally comprise an RF generator, an RF power cable coupled at one end to the RF generator, an impedance matching network, and a RF power cable or a pair of copper straps which connect to the electrodes of the plasma reactor. During operation, the impedance of the plasma reactor is subject to substantial variation. Prior to ignition, the gas in the reactor is not ionized and therefore not conductive. Upon application of RF power, the gas begins to ionize and the load impedance drops as charge carriers are created in the reactor. After the start-up period a steady-state operating condition is eventually achieved.

Variations in the plasma flux (the product of the plasma density and the plasma charge velocity) can also cause significant transients in the load impedance, even during steady-state operations. In addition, during ignition and prior to achievement of steady-state, substantial impedance variations encountered may lead to significant power being reflected back to the RF generator causing it to become unstable and possibly destabilize the plasma process or damage the RF generator. This is especially the case for high "Q" plasma processes. As will be further illustrated, standard non-dissipative filter configurations are not sufficient for the stable operation of the entire range of processes encountered.

In the art of plasma deposition or sputtering, for example, the process is driven by radio frequency energy typically provided at a relatively constant frequency, or band of frequencies such as for instance 13.56 MHz, ±5%, at levels up to several kilowatts. Typically, there is an RF generator coupled to a plasma chamber with a matching network interposed between them to match the impedance of the plasma chamber to the RF generator output source impedance, which is typically 50 ohms.

An RF energy delivery system may comprise an RF generator, a matching network, and a load. Frequency agile plasma systems, which operate over a pre-determined frequency bandwidth instead of a constant frequency, for instance a bandwidth representing a fluctuation of between about ±5 to ±10%, are becoming generally more desirable as they allow greater freedom to accomplish optimal plasma impedance match and thus allow a fixed or variable matching network.

Because the plasma does not behave like a linear ohmic resistance, the application of RF energy by the RF generator to the plasma chamber produces out of band energy which can be at multiples of the source frequency (harmonics) or at fractions thereof (sub-harmonics).

Dissipative filters have often been employed in communications work, for example, as a narrow bandpass I.F. filter after the first down converter of a receiver front end. Dissipative filters are employed to improve performance, where it is needed to provide proper controlled termination to the out of band signals. However, dissipative filters have not been favored because they do not offer the sharp attenuation slope of an equivalent lossless filter. Consequently, because of the shallow attenuation slope and energy dissipation problems, circuit designers have been reluctant to interpose filters of this type in an RF delivery system where the RF power can be several kilowatts.

A dissipative harmonic filter can be interposed in between the generator and the matching network to deal with the problem of out-of-band signals generated by the non-linearity of the plasma load as described in U.S. Pat. No. 5,187,457. Previous attempts to do this have generally involved reflective type lossless filters, which reflect rather than absorb harmonics. This, however, did not solve plasma chamber stability problems associated with specific process conditions, specifically high "Q" recipes, because standard reflective filters with both Chebyshev or elliptic designs do not provide dissipative termination of harmonics. While these designs keep harmonics from the load, they ground harmonics via alternative paths. The harmonics in the ground paths create harmonic ground currents, known as "hot grounds" which create additional gate-source voltage differential, potentially harmful to MOSFET dies. The presence of harmonic ground currents also create harmonically super-imposed fundamental frequency waveform at the MOSFET gates thereby affecting their switching characteristics. This results in inconsistent drive level requirements for the same output power at a given supply voltage. Therefore a diplexer with a terminated high pass filter at the input of the low pass filter may also be interposed between the driver output and amplifier input inside the RF generator.

Cascading filters such as those referenced in U.S. Pat. No. 5,187,457, are dissipative, yet are only suitable for fixed frequency plasma systems because of excessive power loss over the required bandwidth, removal of dissipated power and the associated size. Moreover, these filters lack sufficient rejection of the harmonics and so, in addition, require lossless filters for the desired plasma system harmonic rejection levels.

The semiconductor plasma processing equipment industry demands lower cost and much smaller size plasma generators, as fabrication space is now at a premium. High voltage MOSFETs with innovative circuit topologies, using surface mounted technology and improved cooling methods, have been considered as presenting a possible solution to meet this challenge. However, high voltage MOSFETs are sensitive to harmonic ground currents caused by switch-mode driver output and energy reflected back from the plasma chamber. The occurrence of ground harmonic currents may cause the RF power amplifier to: a) switch inconsistently for the desired performance with respect to power gain and efficiency; b) become unstable and deliver incorrect power with respect to set point; c) cause plasma flux drop-out; and, d) increase gate-source differential voltages causing damage to the MOSFET dies.

These disadvantages of the prior art are overcome by the present invention.

SUMMARY OF THE INVENTION

The present invention is directed to a dual directional diplexer harmonics dissipation filter for a RF generator system which includes an input terminal coupled to a power source providing a radio frequency signal in a predetermined frequency range, an output terminal for providing the radio frequency signal to a load at the predetermined frequency range, a low pass filter having an input and output, the low pass filter connected between the input terminal and the output terminal, a plurality of high pass filters coupled to the low pass filter wherein the plurality of high pass filters dissipate signals in excess of the predetermined frequency range and the plurality of high pass filters have a predetermined circuitry effect selected from the group consisting of capacitance and inductance, and the resultant effect is offset and absorbed by the low pass filter at the input and the output.

Also disclosed is a dual directional harmonics dissipation filter for a frequency agile RF generator system powering a load, comprising an RF power amplifier, an output terminal coupled to the RF power amplifier providing a radio frequency signal in a predetermined frequency range, a low pass filter having an input and an output, an input impedance and an output impedance, the low pass filter coupled to the output terminal, a high pass filter coupled to the low pass filter output wherein the high pass filter receives and dissipates harmonic signals reflected from the load in excess of the predetermined frequency band and wherein the high pass filter's effects on the output impedance of the low pass filter is offset, and filter means for managing harmonic signals produced by the RF power amplifier, the filter means coupled to the low pass filter input wherein the filter means' effects on the input impedance of the low pass filter is offset.

DETAILED DESCRIPTION OF THE INVENTION

Figure 1:
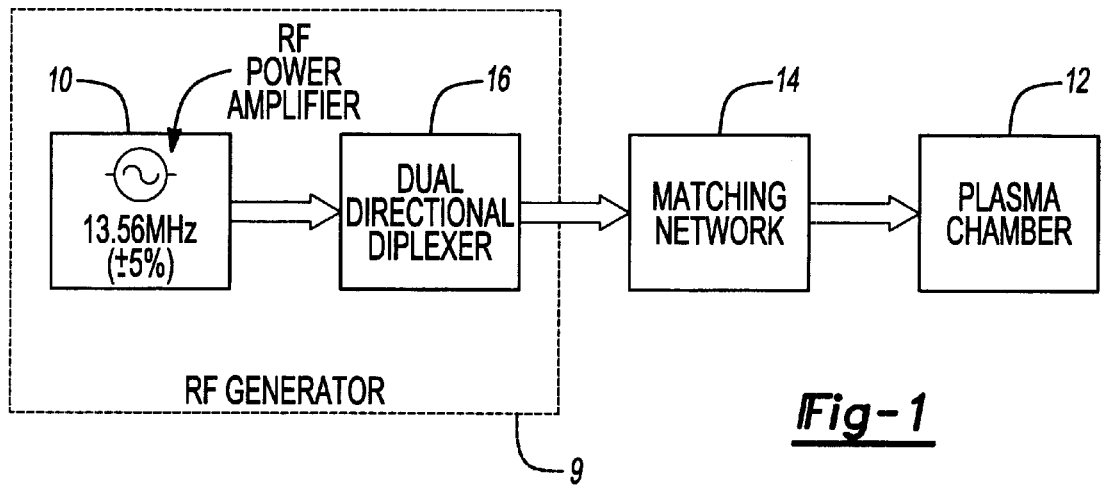
FIG. 1 is a system block diagram of a frequency agile RF plasma system of the preferred embodiment of the invention.

With reference to the drawing and initially to FIG. 1, one embodiment of a system for employing high-power radio frequency (RF) energy comprises an RF generator 9 having an RF power amplifier 10 and a dual directional diplexer 16. The RF power amplifier 10 providing alternating current within a radio frequency band, for instance ±5 to ±10% of 13.56 MHz, at a power of up to 3000 watts for this example. The RF power amplifier 10 has an effective output impedance of 50 ohms. The RF energy is applied to a plasma chamber 12, which imposes an RF load. The load impedance can vary during operation, and is non-linear, thereby converting the frequencies of the input RF energy within the preferred frequency band into energy at frequencies which are multiples or fractions of that input frequency. In accordance with the present invention, impedance matching network 14 is interposed between a dual directional diplexer 16 and plasma chamber load 12 for matching the impedance of the plasma chamber 12 to the 50 ohm impedance of the RF power amplifier 10.

The dual directional diplexer 16 in accordance with the present invention is preferably placed in series with the RF power amplifier 10 and the matching network 14 for passing energy in a passband, for instance, within ±5% centered on the 13.56 MHz frequency, but dissipating energy that is above the passband. The low frequency and subharmoic energy below the passband is dissipated in resistive terminations via other filter networks, not pictured, in the RF power amplifier 10. The dual directional diplexer 16 is illustrated here as being in series between the RF power amplifier 10 and the matching network 14, but it is contemplated that it may also be placed in other suitable locations in the system, e.g. within the RF power generator 9. Given the relatively smaller size of its circuitry, this and other options for placement of the dual directional diplexer 16 within the system are possible.

Figure 2:
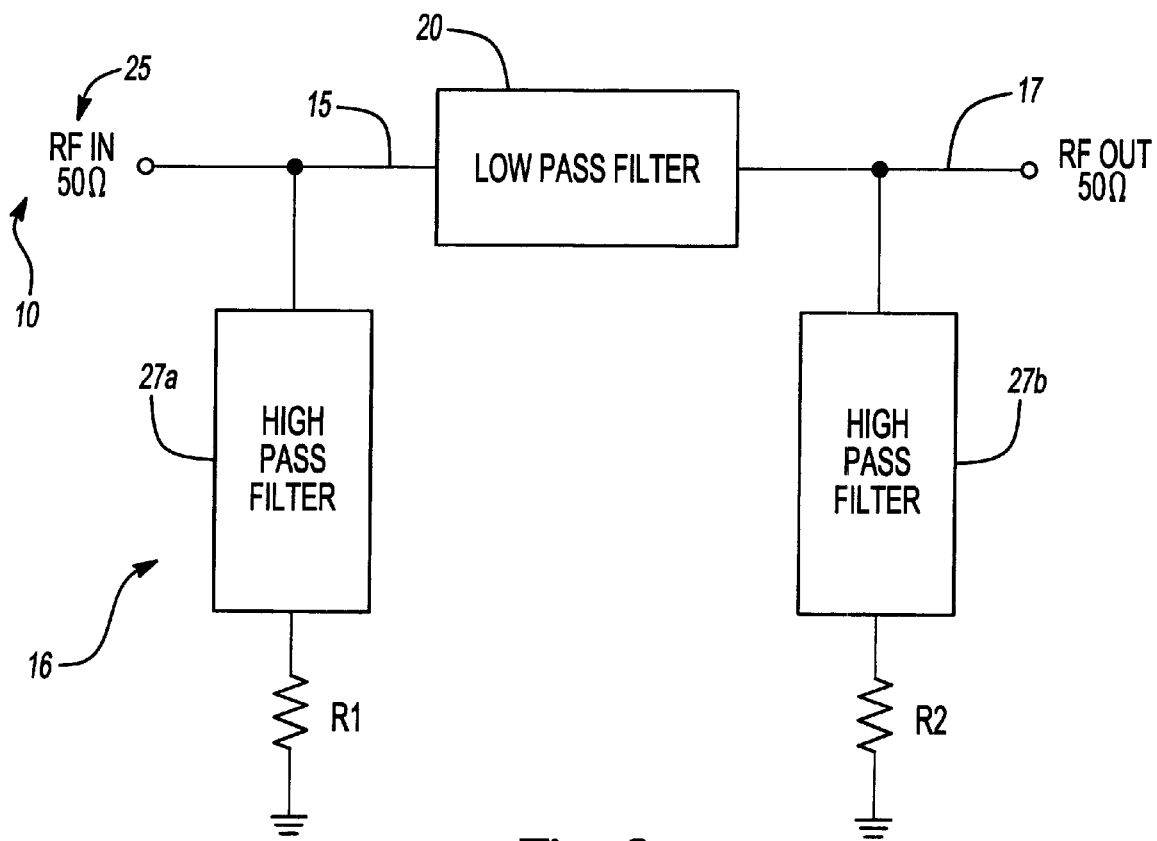
FIG. 2 is a system block diagram of a dual directional diplexer of the preferred embodiment of the invention.

FIG. 2 is a block diagram illustrating the system components of the dual directional diplexer 16. The dual directional diplexer 16 includes low pass filter 20 which receives output 25 from RF power amplifier 10 and at least two high pass filters 27a and 27b to receive and dissipate harmonic energy. In one embodiment of the invention, in order to maintain a −50 dBc, or below, harmonic content and stable operation over the entire dynamic range, diplexer 16 through which the RF power amplifier 10 output 25 passes, includes a fifth order 0.1 dB passband ripple elliptic response low pass filter 20 and a plurality of fifth order 0.1 dB passband ripple Chebyshev response high pass filters. In FIG. 2, high pass filters 27a and 27b are pictured. Depending on the particular application, higher order filters, e.g. seventh or ninth order filters, may also be used. Low pass filter 20 has a cutoff frequency of 16.4 MHz, with a typical rejection floor of −43 dBc. Second harmonic rejection from this filter is typically −42 dBc. The third harmonic rejection is typically −62 dBc. However, for RF generators in plasma applications, the rejection of harmonics by low pass filter 20 is not enough, and steps must be taken to dissipate the harmonics energy.

In the presently preferred embodiment, dissipative termination of harmonics is achieved through at least two high pass filters, 27a and 27b, one added at a junction 15 prior to the input and one added at a junction 17 after the output of the low pass filter 20. Harmonic energy may enter the system in one of two ways. It may be produced by the RF power amplifier 10 or it may be reflected back from the plasma chamber 12 during the transient flux produced by ionization of the plasma medium. Dissipation of harmonics from the RF power amplifier 10 is provided by the high pass filter 27a at the low pass filter 20 input. Dissipation of harmonics reflected back from the plasma chamber 12, coming back toward the RF power amplifier 10, is received by the high pass filter 27b and dissipated.

The diplexer 16, i.e., high pass/low pass filter arrangement, typically minimizes harmonic distortion and has a dissipative harmonic termination for harmonics received at the high pass filters' 27a and 27b inputs. The low pass/high pass filter combination of the present embodiment forms a dual directional diplexer 16 dissipating harmonic energy originating from both the RF power amplifier output and that reflected back from the plasma chamber load.

Other dual directional harmonic filter arrangements, including high pass and low pass filters, are contemplated and are within the scope of this invention. For instance, more than two high pass filters may be utilized to increase dissipation of harmonic energy with or without additional low pass filters. Moreover, use of only one high pass filter, connected at a junction between the low pass filter output and the load, to dissipate energy reflected back from the plasma chamber, may be employed in conjunction with other means for managing, e.g. dissipating, reflecting and/or grounding, harmonic energy produced from the RF power amplifier. In other words, the single high pass filter at the low pass filter output may be used without a second high pass filter at the low pass filter input, but rather with a diplexer, reflective type filter or cascading dissipative filter, located, for instance, elsewhere within the RF generator circuitry, such as incorporated into RF power amplifier circuitry, or as a separate harmonics filter circuitry in series between the RF generator and the matching network to provide reflection, dissipation or grounding of harmonics produced by the RF generator during operation.

In the presently preferred embodiment, the harmonics from the RF power amplifier and/or the plasma chamber are dissipated in the high pass filters' 27a and 27b resistive terminations without appreciably affecting the signal that is within the bandwidth, for instance between ±5% of 13.56 MHz, for frequency agile plasma systems. High pass filters 27a and 27b reduce the harmonic ground current and thus protect the RF generator from becoming unstable and/or delivering RF power to the plasma chamber 12 at a level much lower than at the set point and thereby causing flux drop-out in the plasma. The lower level of harmonic ground currents also protect the MOSFET dies in the power source from excessive gate-source voltage differential, typically not to exceed the ±30 volts specification limits. Thus, in conjunction with low frequency and sub-harmonic resistive terminations, the presently preferred dual directional diplexer 16 provides stable operation of the RF power amplifier 10 over the entire range of voltage standing wave ratios (VSWRs) and over the complete dynamic range of the system. This is particularly important for the stability of plasma systems performing high "Q" processes.

The high pass filters 27a and 27b in the preferred embodiment have a fifth order, 0.1 dB passband ripple, Chebyshev response and dissipate up to about 500 watts of power. The cutoff frequency of the high pass filters is 23.2 MHz with a 3 dB point at 20.4 MHz. Depending on the particular application, higher order filters, e.g. seventh or ninth order filters, may also be used. While higher order filters will have less effect on the impedance and frequency response of the associated low pass filter, the increase in circuitry size is appreciable. Other specifications for the high pass filters applicable to the processes described herein will occur to those skilled in the art.

Figure 3:
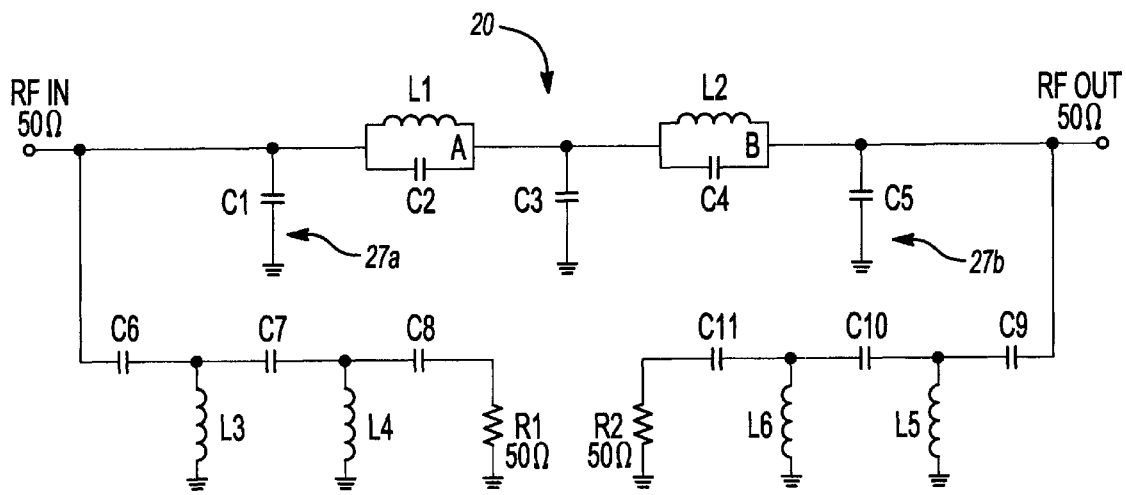
FIG. 3 is a schematic diagram of the dual directional diplexer of the preferred embodiment of the invention.

The high pass filters 27a and 27b and low pass filter 20 are shown in more detail in the schematic diagram of FIG. 3, in which the low pass filter 20 may be tuned to a bandwidth between ±5% of 13.56 MHz. The low pass filter 20 may be of an elliptical design having capacitors C1, C3, and C5 shorting out-of-band higher frequencies, and parallel LC resonance paths A and B having inductors L1 and L2 as well as capacitors C2 and C4, blocking out-of-band higher frequencies, and passing the amplified clean RF signal at 13.56 MHz and over the, for instance, ±5% bandwidth. While illustrated as an elliptic design in FIG. 3, the low pass filter 20 may also employ a Chebyshev design having shunt input-output capacitance or series input-output inductance topology.

The high pass filters 27a and 27b are each made up of a series of capacitors, respectively, C6, C7, and C8, and C9, C10 and C11 appearing as shorts to higher frequencies (harmonics) and as opens, blocking low frequency currents from reaching the termination resistors, R1 and R2. Inductances L3 and L4 as well as L5 and L6 appear as shorts to lower frequencies and opens to higher frequencies. In the high pass filters 27a and 27b, the bypassed higher frequency components which include 2nd, 3rd, 4th, 5th, etc. harmonics, are preferably consigned to a 50 Ohm dissipating resistance, R1 and R2. Frequencies lower than the predetermined band fall within the high pass filters' 27a and 27b reject bands.

In the preferred embodiment of FIG. 3, the high pass filters 27a and 27b each have a capacitance input, represented, respectively, by capacitors C6 and C9. While the high pass filters 27a and 27b in FIG. 3 are Chebyshev in design, it is also contemplated that these may also be elliptic in design. The low pass filter 20 includes a capacitive input and output, respectively, C1 and C5, complementing the capacitive inputs of the high pass filters 27a and 27b in the reject band. The invention, therefore, contemplates offset, by the low pass filter's 20 input and output circuitry, of the capacitative effects of the high pass filters 27a and 27b on impedance to regain performance within the desired fundamental frequency band.

For instance, the selected high pass filter topology (using series input capacitors) has capacitive input impedance in the reject band, resulting in an equivalent capacitance value in the predetermined frequency band, e.g. a bandwidth of ±5% 13.56 MHz. This equivalent input capacitance of the high pass filters 27a and 27b can be offset by lowering the value of the low pass filter 20 input-output capacitance so that the high pass filter equivalent input capacitance is absorbed by the low pass filter. Proper offset of this equivalent input capacitance at both input-output terminals of the low pass filter 20 results in regaining the desired input-output impedances and frequency response.

Figure 4:
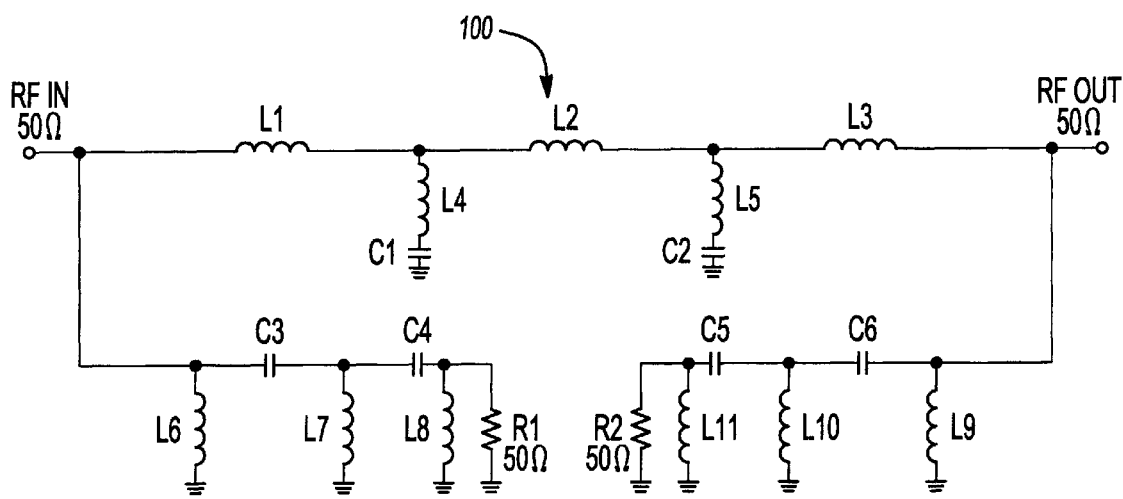
FIG. 4 is a schematic diagram of the dual directional diplexer of an alternative embodiment of the invention.

FIG. 4 illustrates an alternative embodiment of the invention. The low pass filter 100 uses inductance input L1 and inductance output L3, along with inductances L2, L4 and L5 and capacitors C1 and C2. High pass filters 200 and 300 employ inductance inputs L6 and L9, as well as inductances L7, L8 and L10 and L11, in series with capacitors C3 and C4 as well as C5 and C6, terminating in resistances R1 an R2 each having 50 ohms resistance values, for harmonic dissipation. At the pre-determined band of frequencies (for instance, 13.56 MHz, ±5%), the high pass filters 200 and 300 may have equivalent inductance values at their input ports. This inductance effect can be offset and absorbed by the inductive input and output ports series input inductance of the low pass filter 20 by adjusting inductance values at the low pass filter 20 input and output.

Various modifications of this harmonic filter are possible depending on the intended application. For example, the resistors, inductors and capacitors can be matched to an impedance other than 50 ohms, if appropriate.

Moreover, the dual directional diplexer can also be employed in other high-power, high frequency applications where a non-linear source drives a linear or non-linear load with high VSWR.

While the invention has been described in respect to the above embodiments of the invention, it should be understood that the invention is not limited to these precise embodiments. Rather, many modifications and variations will present themselves to persons skilled in the art without departure from the scope and spirit of the inventions, which is defined in the appended claims.

What is claimed is:

1. A dual directional harmonics dissipation filter for a radio frequency generator system for coupling between an RF amplifier capable of providing a radio frequency signal in a predetermined frequency range, and a load, said filter comprising:
   an input terminal coupled to said RF power amplifier; an output terminal coupled to said load;
   a low pass filter having an input and output, the low pass filter connected between the input terminal and the output terminal; and
   a plurality of high pass filters each coupled in parallel to the low pass filter wherein the plurality of high pass filters receive and dissipate signals in excess of the predetermined frequency range.

2. The filter of claim 1, wherein the plurality of high pass filters comprise a first high pass filter and a second high pass filter, the first high pass filter being connected at a junction between the input terminal and the low pass filter input and the second high pass filter being connected at a junction between the low pass filter output and the output terminal.

3. The filter of claim 1, wherein the load comprises a plasma chamber.

4. The filter of claim 3, wherein the output terminal is coupled to the plasma chamber via an impedance matching network.

5. The filter of claim 1, wherein the predetermined frequency range is about ±5% of 13.56 MHz.

6. The filter of claim 1, wherein the low pass filter comprises a Chebyshev design.

7. The filter of claim 1, wherein the low pass filter comprises an elliptical design.

8. The filter of claim 1, wherein the low pass filter comprises shunt input and output capacitance values.

9. The filter of claim 1, wherein the low pass filter comprises a series input and output inductance values.

10. The filter of claim 1, wherein the high pass filters have associated resistance values of about 50 ohms.

11. The filter of claim 1, wherein the plurality of high pass filters comprise one of Chebyshev or elliptic designs.

12. The filter of claim 1, wherein the high pass filters have power dissipation capacities of about 500 watts.

13. The filters of claim 1, wherein the plurality of high pass filters each have capacitive inputs having a predetermined capacitance value at the predetermined frequency range.

14. The filter of claim 1, wherein the plurality of high pass filters have inductive inputs having a predetermined inductance value at the predetermined frequency range.

15. The filter of claim 1, wherein the high pass filters comprise fifth order, 0.1 dB passband ripple, −22 dBc minimum rejection Chebyshev design.

16. A dual directional harmonics dissipation filter for a frequency agile RE generator system having an RE generator and RE power amplifier for powering a load, said RE power amplifier providing a radio frequency signal in a predetermined frequency range, said filter comprising:
   an input terminal coupled to the RF power amplifier;
   an output terminal coupled to the load via an impedance matching network;
   a low pass filter having an input and an output, an input impedance and an output impedance, the low pass filter connected between the input terminal and the output terminal;
   a high pass filter coupled in parallel to the low pass filter output wherein the high pass filter receives and dissipates harmonic signals reflected from the load in excess of the predetermined frequency; and
   a filter for managing harmonic signals produced by the RE power amplifier, the filter coupled in parallel to the low pass filter input wherein the filter compensates the input impedance of the low pass filter.

17. The filter of claim 16, wherein the high pass filter is connected at a junction between the low pass filter output and the output terminal.

18. The filter of claim 16, wherein the low pass filter, high pass filter and filter define a diplexer located at the RE power amplifier.

19. The filter of claim 16, wherein the filter comprises a cascading filter located at the power amplifier.

20. The filter of claim 16, wherein the filter comprises a reflective filter.

21. The filter of claim 16, wherein the load comprises a plasma chamber and the output terminal is coupled to the plasma chamber through an impedance matching network.

22. The filter of claim 16, wherein the predetermined frequency band is a range about ±10% of 13.56 MHz.

23. The filter of claim 16, wherein the predetermined frequency range is about ±5% of 13.56 MHz.

24. The filter of claim 16, wherein the low pass filter comprises a Chebyshev design.

25. The filter of claim 16, wherein the low pass filter comprises an elliptic design.

26. The filter of claim 16, wherein the low pass filter comprises shunt input and output capacitance values.

27. The filter of claim 16, wherein the low pass filter comprises a series input and output inductance.

28. The filter of claim 16, wherein the high pass filter has a resistance value of about 50 ohms.

29. The filter of claim 16, wherein the high pass filter has a power dissipation capacity of about 500 watts.

30. The filter of claim 16, wherein the high pass filter has a capacitive input having a predetermined capacitance value at the predetermined frequency range.

31. The filter of claim 16, wherein the high pass filter has inductive inputs having a predetermined inductance value at the predetermined frequency range.

32. The filter of claim 31 wherein the low pass filter has an inductance output having a predetermined inductance value at the predetermined frequency range.

33. The filter of claim 30, wherein the low pass filter has a capacitive output having a predetermined capacitance value.

34. The filter of claim 33, wherein an effect of the capacitance value of the high pass filter on impedance is offset at the low pass filter output.

35. The filter of claim 32 wherein an effect of the inductance value of the high pass filter on impedance is offset at the low pass filter output.

36. The filter of claim 1, wherein the plurality of high pass filters have a predetermined circuitry effect selected from the group consisting of capacitance and inductance, said effect being offset by the low pass filter at the input and the output.

37. The filter of claim 16, wherein the high pass filter has a predetermined circuitry effect on impedance at the low pass filter output, the effect selected from the group of capacitance and inductance, and the effect is offset by the low pass filter at the output.

38. The filter of claim 16, wherein the filter has a predetermined circuitry effect on impedance at the low pass filter input, the effect selected from the group of capacitance and inductance, and the effect is offset by the low pass filter at the input.

* * * * *